United States Patent
Takashima et al.

(10) Patent No.: US 10,141,192 B2
(45) Date of Patent: Nov. 27, 2018

(54) MANUFACTURING METHOD OF SEMICONDUCTOR DEVICE

(71) Applicant: FUJI ELECTRIC CO., LTD., Kanagawa (JP)

(72) Inventors: Shinya Takashima, Hachioji (JP); Katsunori Ueno, Matsumoto (JP); Masaharu Edo, Tokorozawa (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/498,503

(22) Filed: Apr. 27, 2017

(65) Prior Publication Data

US 2017/0372905 A1    Dec. 28, 2017

(30) Foreign Application Priority Data

Jun. 23, 2016  (JP) .................................. 2016-125019

(51) Int. Cl.
*H01L 21/265* (2006.01)
*H01L 21/324* (2006.01)
(Continued)

(52) U.S. Cl.
CPC .... *H01L 21/26546* (2013.01); *H01L 21/3245* (2013.01); *H01L 29/1095* (2013.01);
(Continued)

(58) Field of Classification Search
None
See application file for complete search history.

(56) References Cited

U.S. PATENT DOCUMENTS

2015/0380498 A1* 12/2015 Tanaka ................ H01L 29/7802
257/76

FOREIGN PATENT DOCUMENTS

JP   H8-186332 A    7/1996
JP   2540791 B2    10/1996
(Continued)

OTHER PUBLICATIONS

Akira Uedono et al., Vacancy-type defects and their annealing behaviors in Mg-implanted GaN studied by a monoenergetic positron beam, Physica Status Solidi(b), vol. 252, issue 12, p. 2794-2801, Dec. 2015.

*Primary Examiner* — Jack Chen (57) ABSTRACT

When a nitride semiconductor layer into which impurity ions have been implanted is subjected to annealing after a protective film is provided on the nitride semiconductor layer, vacancy defects may be disadvantageously prevented from escaping outside through the surface of the nitride semiconductor layer and disappearing. A manufacturing method of a semiconductor device including a nitride semiconductor layer is provided. The manufacturing method includes implanting impurities into the nitride semiconductor layer, performing a first annealing on the nitride semiconductor layer at a first temperature within an atmosphere of a nitrogen atom containing gas without providing a protective film on the nitride semiconductor layer, forming the protective film on the nitride semiconductor layer after the first annealing, and after the protective film is formed, performing a second annealing on the nitride semiconductor layer at a second temperature that is higher than the first temperature.

11 Claims, 10 Drawing Sheets

(51) Int. Cl.
  *H01L 29/10* (2006.01)
  *H01L 29/861* (2006.01)
  *H01L 29/20* (2006.01)
  *H01L 29/78* (2006.01)
  *H01L 29/207* (2006.01)
  *H01L 29/66* (2006.01)

(52) U.S. Cl.
  CPC ........ *H01L 29/2003* (2013.01); *H01L 29/207* (2013.01); *H01L 29/66204* (2013.01); *H01L 29/66522* (2013.01); *H01L 29/66666* (2013.01); *H01L 29/66712* (2013.01); *H01L 29/7802* (2013.01); *H01L 29/861* (2013.01)

(56) References Cited

FOREIGN PATENT DOCUMENTS

| | | |
|---|---|---|
| JP | 2002-176004 A | 6/2002 |
| JP | 2009-170604 A | 7/2009 |

\* cited by examiner

MANUFACTURING METHOD OF SEMICONDUCTOR DEVICE

The contents of the following Japanese patent application are incorporated herein by reference:
NO. 2016-125019 filed in JP on Jun. 23, 2016.

BACKGROUND

1. Technical Field

The present invention relates to a manufacturing method of a semiconductor device.

In the conventional art, it is known to provide a cap layer on a gallium nitride compound semiconductor doped with p-type impurities and subsequently perform annealing (see, for example, Japanese Patent No. 2540791 and Japanese Patent Application Publication No. 8-186332). It is also known to, without providing a cap layer, thermally treat a gallium nitride semiconductor film to which p-type dopants have been implanted within an atmosphere containing at least one of ammonia and a hydrazine-based compound (see, for example, Japanese Patent Application Publication No. 2009-170604). Furthermore, it is also known to implant $Mg^+$ ions into a Group-III nitride semiconductor while concurrently implanting $N^+$ ions (see, for example, Japanese Patent Application Publication No. 2002-176004). It has been reported that, when GaN to which Mg has been implanted is subjected to annealing at 1000° C., vacancy defects may aggregate (see, for example, FIG. 10 in Akira Uedono et al., Vacancy-type defects and their annealing behaviors in Mg-implanted GaN studied by a monoenergetic positron beam, Physica Status Solidi (b), vol. 252, issue 12, p. 2794-2801, December 2015).

When a nitride semiconductor layer into which impurity ions have been implanted is subjected to annealing after a protective film is provided on the nitride semiconductor layer, vacancy defects may be disadvantageously prevented from escaping to the surface of the nitride semiconductor layer and disappearing.

SUMMARY

A first aspect of the innovations herein provides a manufacturing method of a semiconductor device including a nitride semiconductor layer. The manufacturing method of a semiconductor device may include implanting, performing a first annealing, and performing a second annealing. During the implanting, impurities may be implanted into the nitride semiconductor layer. During the performing a first annealing, a first annealing may be performed on the nitride semiconductor layer at a first temperature within an atmosphere of a nitrogen atom containing gas without providing a protective film on the nitride semiconductor layer. After the first annealing, the protective film may be formed on the nitride semiconductor layer. After the protective film is formed, during the performing a second annealing, a second annealing may be performed on the nitride semiconductor layer at a second temperature that is higher than the first temperature.

The first temperature may be a temperature at which thermal decomposition of the nitride semiconductor layer does not proceed within the atmosphere of the nitrogen atom containing gas.

The nitrogen atom containing gas used for the first annealing may contain an ammonia gas.

The nitrogen atom containing gas used for the first annealing may further contain a nitrogen gas.

The nitrogen atom containing gas used for the first annealing may contain a nitrogen gas. A pressure of the atmosphere of the nitrogen atom containing gas may be 1 MPa or higher and 150 MPa or lower. The first temperature for the first annealing may be 1200° C. or lower.

The first temperature for the first annealing may be 800° C. or higher.

The second temperature for the second annealing may be 1100° C. or higher.

The nitride semiconductor layer may be subjected to the first annealing at the first temperature for a duration of 10 minutes or longer and 2 hours or shorter. The nitride semiconductor layer may be subjected to the second annealing at the second temperature for a duration of 1 minute or longer and less than 10 minutes.

The nitride semiconductor layer may be made of gallium nitride. Ion species of the impurities used for the implantation may include one or more types from among magnesium, calcium, beryllium and zinc ions.

The summary clause does not necessarily describe all necessary features of the embodiments of the present invention. The present invention may also be a sub-combination of the features described above.

DESCRIPTION OF THE EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
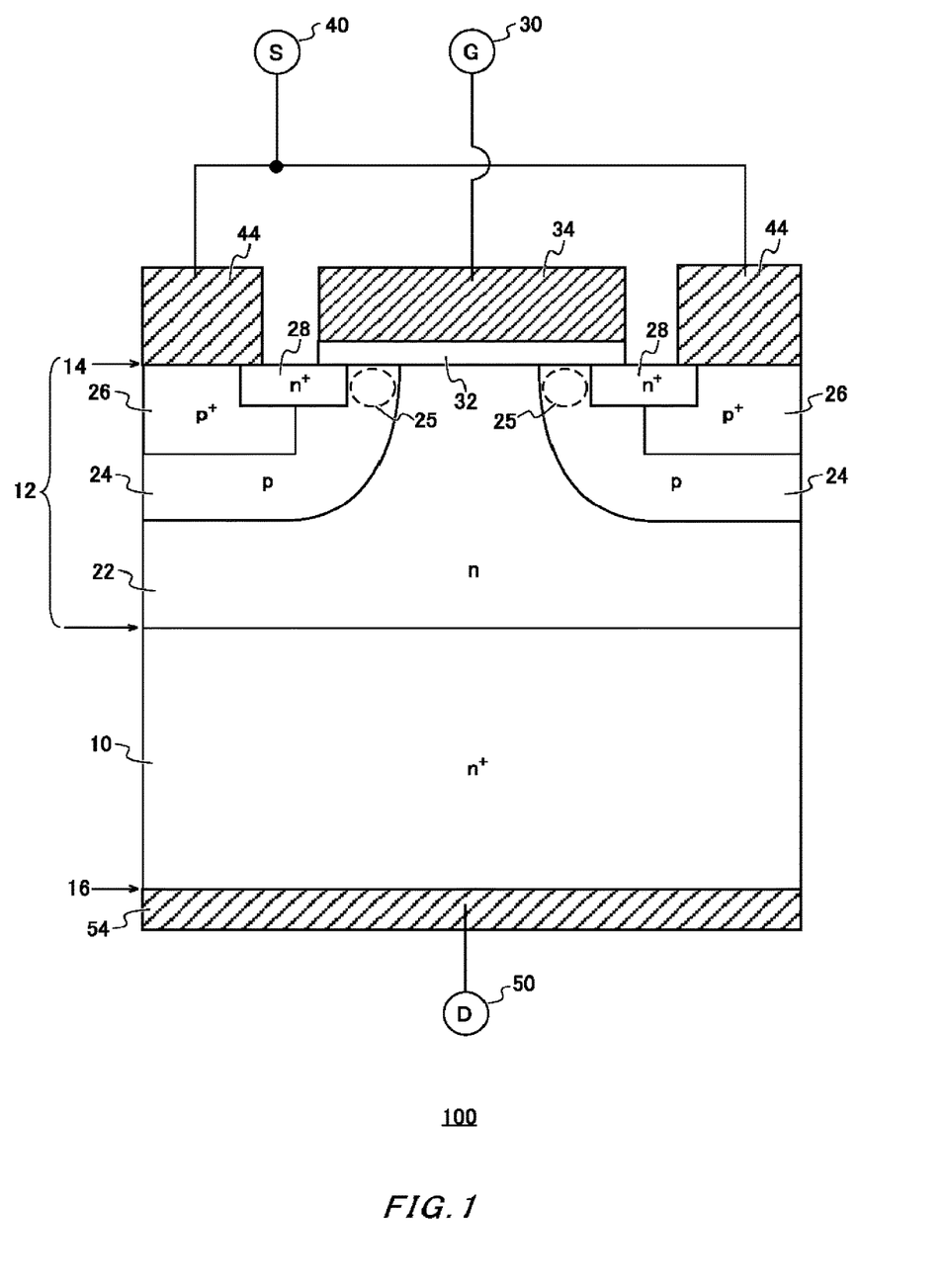
FIG. 1 schematically shows a MOSFET 100 relating to a first embodiment.

FIG. 1 schematically shows a MOSFET 100 relating to a first embodiment. In the present example, the MOSFET (metal oxide semiconductor field effect transistor) 100 is a so-called vertical MOSFET. The MOSFET 100, which is shows as an exemplary semiconductor device, may be capable of switching whether current flows are allowed or prevented.

In the present example, the MOSFET 100 has an $n^+$-type GaN substrate 10, a GaN layer 12, which is shown as an exemplary nitride semiconductor layer, a gate insulator film 32, a gate electrode 34, a source electrode 44 and a drain electrode 54.

The GaN layer 12 is provided on and in direct contact with the GaN substrate 10. In the present example, the GaN layer 12 is a homoepitaxial layer provided on the GaN substrate 10. In the present example, a front surface 14 is one of the main surfaces of the GaN layer 12 that is not in contact with the GaN substrate 10. In addition, a back surface 16 is one of the main surfaces of the GaN substrate 10 that is not in contact with the GaN layer 12.

In the present example, the terms such as "on" mean the direction extending from the back surface 16 of the GaN substrate 10 toward the front surface 14 of the GaN layer 12. The terms such as "under" means the opposite direction to the terms such as "on." The terms such as "on" and "under" may not necessarily mean the vertical direction to the ground. The terms such as "on" and "under" are merely used for convenience in order to specify the relative positions of the layers, films and the like.

An impurity-implanted region of the GaN layer 12 may be exposed at at least part of the front surface 14. In the present example, the impurity-implanted region may include a p-type well 24, a $p^+$-type well 26 and an $n^+$-type well 28 that are formed within a predetermined range of depths from the front surface 14. Note that the term "n-type" means n-type impurities for nitride semiconductors and the term "p-type" means p-type impurities for nitride semiconductors.

The ion species used as the n-type impurities for the implantation purposes may include one or more types of elements selected from silicon (Si), germanium (Ge) and oxygen (O). In the present example, Si is used as the n-type impurities. The ion species used as the p-type impurities for the implantation purposes may include one or more types of elements of magnesium (Mg), calcium (Ca), beryllium (Be) and zinc (Zn). In the present example, Mg is used as the p-type impurities.

The n-type region 22 serves as a drift layer of the MOSFET 100. In the p-type well 24, a portion that is directly under the gate insulator film 32 and positioned between the n-type region 22 and the $n^+$-type well 28 serves as a channel forming region 25. The $p^+$-type well 26 is capable of lowering the contact resistance with the source electrode 44 and also capable of providing a hole pulling path when the MOSFET 100 is turned off. The $n^+$-type well 28 serves as a source region.

The gate insulator film 32 is at least provided on and in direct contact with the p-type well 24 and the n-type region 22. The gate electrode 34 is provided on and in direct contact with the gate insulator film 32. The source electrode 44 is electrically connected to the $n^+$-type well 28 and the $p^+$-type well 26. The drain electrode 54 is in direct contact with the back surface 16 of the GaN substrate 10.

A gate terminal 30, a source terminal 40 and a drain terminal 50 are respectively indicated by the circled letters D and S. For example, when the drain electrode 54 has a predetermined high potential and the source electrode 44 has a ground potential, application of a potential equal to or higher than a threshold voltage from the gate terminal 30 to the gate electrode 34 forms an electric charge inverting layer in the channel forming region 25, which allows currents to flow from the drain terminal 50 to the source terminal 40. On the other hand, application of a potential lower than the threshold voltage to the gate electrode 34 erases the electric charge inverting layer in the channel forming region 25, which blocks the currents.

Figure 2:
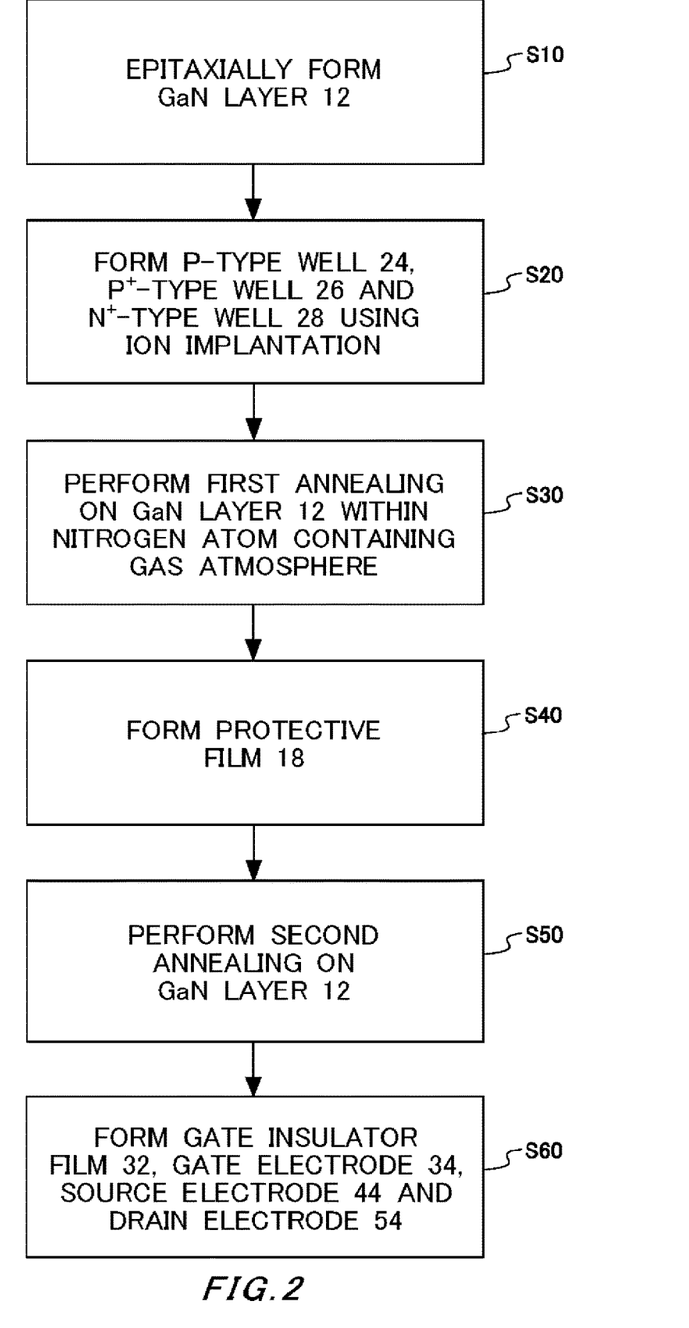
FIG. 2 is a flow chart showing a process of manufacturing the MOSFET 100 relating to the first embodiment.

FIG. 2 is a flow chart showing a process of manufacturing the MOSFET 100 relating to the first embodiment. The manufacturing process of the present example is performed in the order of steps S10 to S60. The manufacturing process of the present example includes a step of epitaxially forming the GaN layer 12 (S10), a step of implanting impurity ions into the front surface 14 of the GaN layer 12 (S20), a step of performing a first annealing (S30), a step of providing a protective film 18 on the front surface 14 of the GaN layer 12 (S40), a step of performing a second annealing on the GaN layer 12 (S50), and a step of forming the gate insulator film 32 and the like (S60).

Figure 3A:
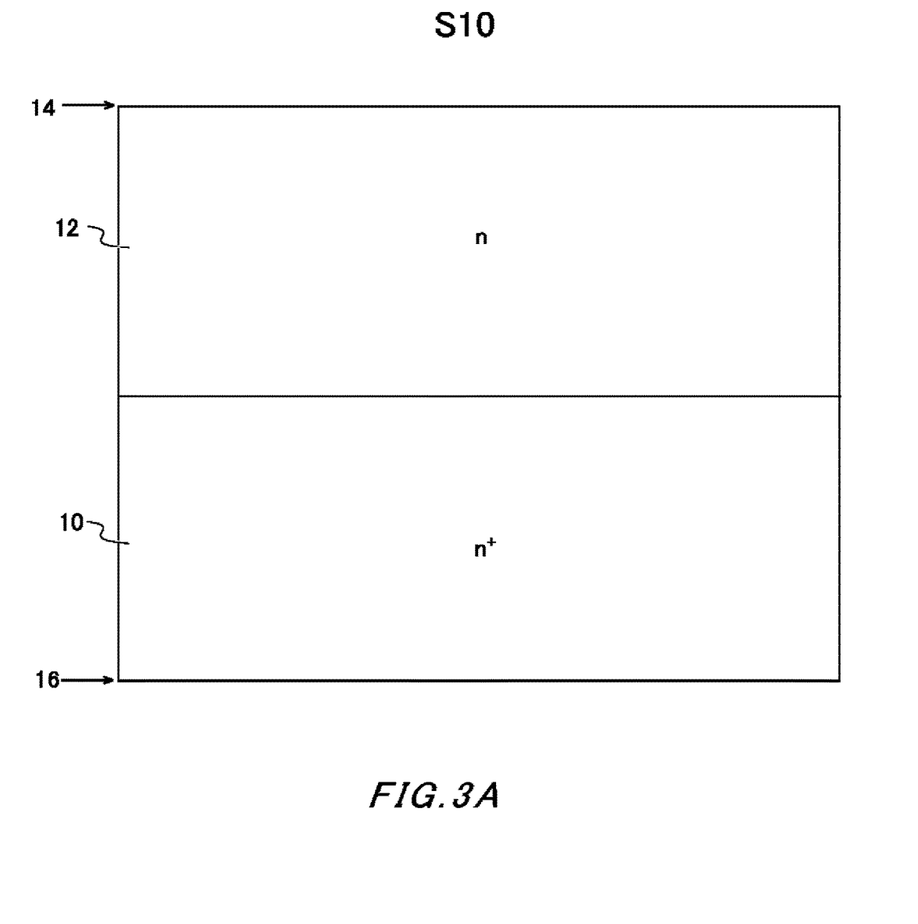
FIG. 3A shows a step S10 of the manufacturing process.

FIG. 3A shows the step S10 of the manufacturing process. In the step S10 of the present example, in order to epitaxially form the GaN layer 12 on the GaN substrate 10 using metal organic chemical vapor deposition (MOCVD), a source gas containing trimethylgallium ($Ga(CH_3)_3$), ammonia ($NH_3$) and monosilane ($SiH_4$) and a press-down gas containing nitrogen ($N_2$) and hydrogen ($H_2$) are fed onto the GaN substrate 10. Here, the silicon (Si) contained in the monosilane serves as the n-type impurities for the GaN layer 12.

The GaN substrate 10 may have a threading dislocation density of $10^7$ cm$^{-2}$ or less. This requirement can contribute to effectively produce effects of reducing the defects in the GaN layer 12. To be specific, when the GaN substrate 10 has a threading dislocation density higher than $10^7$ cm$^{-2}$, the effects of reducing the defects that can be produced by the present example may be offset by the threading dislocations. Therefore, such a high density is not desirable. Note that, however, the manufacturing process of the present example can reduce the defects in the GaN layer 12 irrespective of the threading dislocation density of the GaN substrate 10.

In other examples, in place of the GaN substrate 10, a SiC (silicon carbide) or zirconium boride ($ZrB_2$) substrate may be used. In place of MOCVD, halide vapor phase epitaxy (HVPE) or molecular beam epitaxy (MBE) may be used. In any of the cases, however, the threading dislocation density is desirably $10^7$ cm$^{-2}$ or less.

Figure 3B:
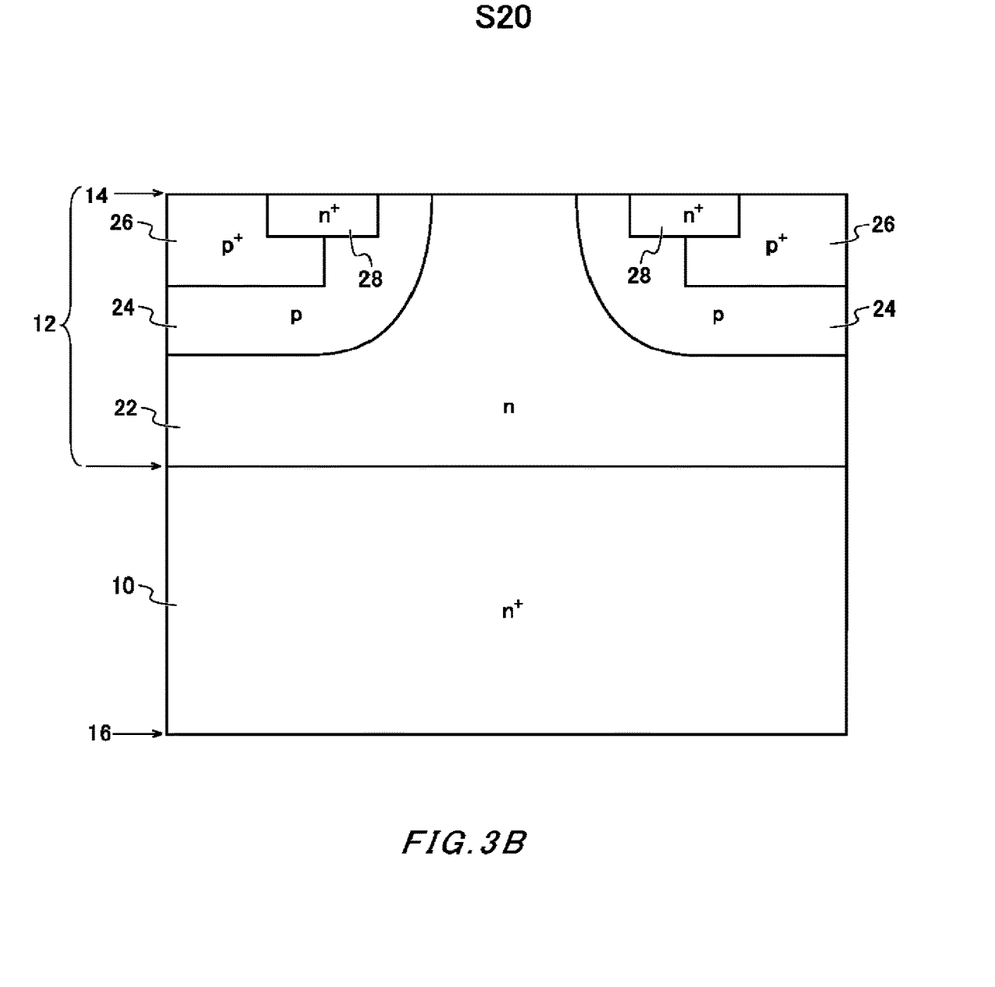
FIG. 3B shows a step S20 of the manufacturing process.

FIG. 3B shows the step S20 of the manufacturing process. In the step S20 of the present example, impurities are selectively ion-implanted through a photoresist mask provided on the n-type region 22 of the GaN layer 12. In this manner, the p-type well 24, the $p^+$-type well 26 and the $n^+$-type well 28 are formed.

To start with, in order to form the p-type well 24, p-type impurities are implanted into the GaN layer 12. In the present example, Mg is ion-implanted into the GaN layer 12 in multiple steps with the accelerating voltage being set to 20, 40, 70, 110, 150, 200, 250 and 430 keV and the dosage being set to 6E+12 cm$^{-2}$. In this manner, as a result of the step S50, the p-type well 24 having an impurity concentration of 1E+17 cm$^{-3}$ can be formed. Here, the letter "E" means powers of 10. For example, E+17 means $10^{17}$.

Subsequently, in order to form the $p^+$-type well 26, p-type impurities are implanted into the GaN layer 12. In the present example, Mg is ion-implanted into the p-type well 24 with the accelerating voltage being set to 10 keV and the dosage being set to 4.5E+13 cm$^{-2}$. In this manner, as a result of the step S50, the $p^+$-type well 26 having an impurity concentration of 2E+19 cm$^{-3}$ can be formed.

Subsequently, in order to further form the $n^+$-type well 28, n-type impurities are implanted into the GaN layer 12. In the present example, Si is ion-implanted into the p-type well 24 and the $p^+$-type well 26 in multiple steps with the accelerating voltage being set to 30, 60 and 80 keV and the dosage being set to 3E+15 cm$^{-2}$. In this manner, as a result of the step S50, the $n^+$-type well 28 having an impurity concentration of 1E+20 cm$^{-3}$ can be formed.

Figure 3C:
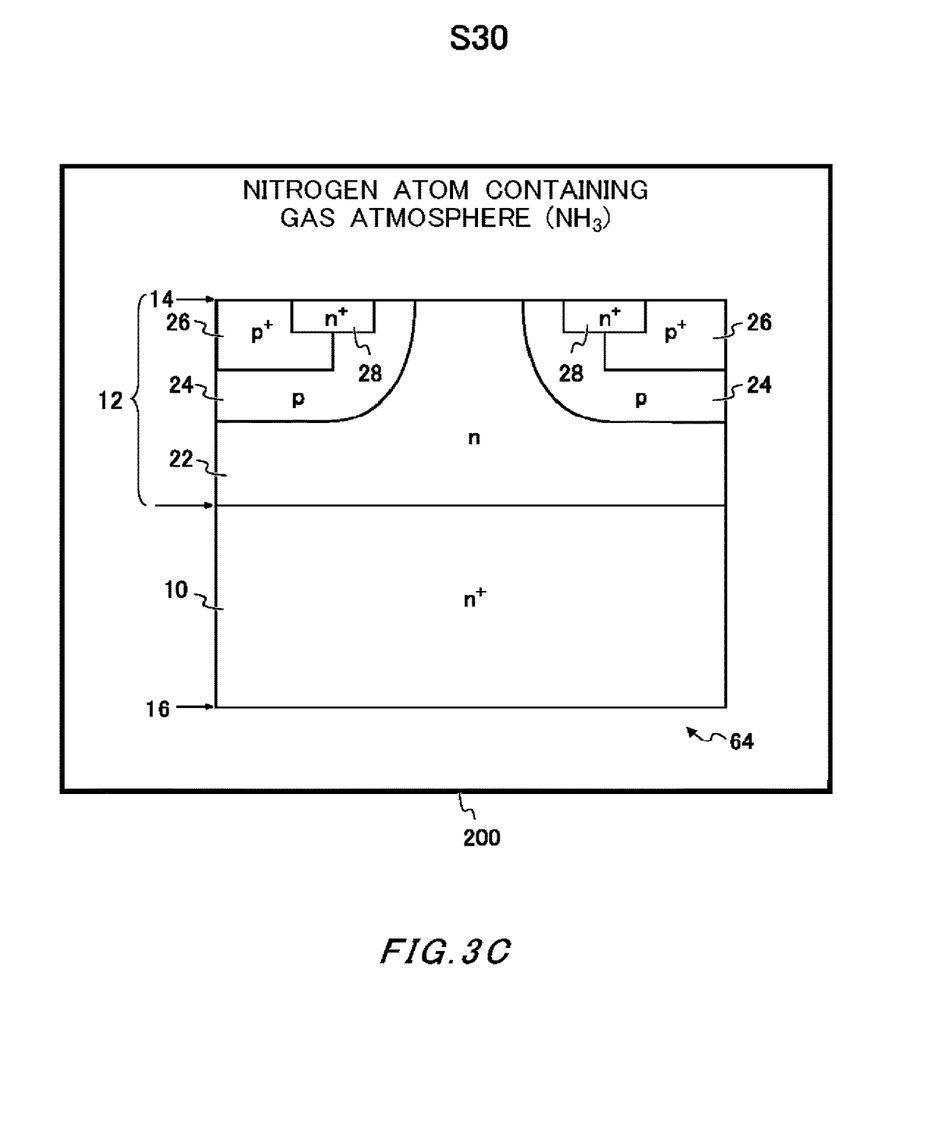
FIG. 3C shows a step S30 of the manufacturing process.

FIG. 3C shows the step S30 of the manufacturing process. The step S30 is a step of performing a first annealing, in which the GaN layer 12 is subjected to annealing at a first temperature ($T_1$) within a nitrogen atom containing gas atmosphere, without the protective film 18 on the GaN layer 12. The step of performing the first annealing may be instead referred to as a pre-annealing step.

In the step S30 of the present example, a first stack structure 64 made up by the GaN substrate 10 and the GaN layer 12 is positioned within a thermal treatment apparatus 200, into which a nitrogen atom containing gas such as an ammonia gas is introduced. Subsequently, the first stack structure 64 is heated to the first temperature ($T_1$) to perform the first annealing.

GaN is thermally decomposed at high temperatures according to the following chemical reaction formula (1). Note that the letters "S," "L" and "G" in brackets respectively mean the solid phase, liquid phase, and gas phase.

$$GaN(S) \leftrightarrow Ga(L) + (1/2)N_2(G) \qquad (1)$$

The ammonia ($NH_3$) gas may be in the state of equilibrium expressed by the following chemical reaction formula (2) within the treatment chamber.
In the formula, the letter "N" with an asterisk means the nitrogen atom in the active state.

$$NH_3(G) \leftrightarrow N^*(G) + (3/2)H_2(G) \qquad (2)$$

Here, Ga(L) may be in the state of equilibrium expressed by the following chemical reaction formula (3) within the ammonia gas atmosphere.

$$Ga(L) + NH_3(G) \leftrightarrow GaN(S) + (3/2)H_2(G) \qquad (3)$$

When the nitrogen atom containing gas contains an ammonia gas as mentioned above, a chemical reaction proceeds to change Ga(L) back into GaN(S). Therefore, the presence of the ammonia gas can prevent the decomposition of GaN. Note that, in the present example, the nitrogen atom containing gas contains in partial pressure ratio an ammonia gas of 10% to 20% and a nitrogen gas of 90% to 80%. Note that, in other examples, the nitrogen atom containing gas may solely contain an ammonia gas.

The first temperature ($T_1$) of the step of performing the first annealing may be such a temperature that the thermal decomposition of the GaN layer 12 does not proceed within the nitrogen atom containing gas atmosphere. Here, the temperature at which the thermal decomposition does not proceed may mean that the decomposition of the GaN does not proceed since Ga(L) changes back into GaN(S). In the present example, the first temperature ($T_1$) is lower than a second temperature ($T_2$) in a step of performing a second annealing. At the first temperature ($T_1$), the GaN layer 12 is subjected to pre-annealing. Here, the protective film 18 is not provided on the front surface 14. Therefore, the vacancy defects that have been formed in the GaN layer 12 during the ion implantation step (S20) can escape to the front surface 14 of the GaN layer 12.

The vacancy defects (for example, nitrogen vacancy defects) that have moved to the front surface 14 can accommodate therein nitrogen again. This may represent the reaction between Ga(L) and the active nitrogen atoms, which is expressed by the above chemical reaction formulas (2) and (3). In this way, while the GaN layer 12 is prevented from decomposing, the vacancy defects in the GaN layer 12 can be reduced.

Since the nitrogen vacancy defects serve as donor defects, the nitrogen vacancy defects in the GaN layer 12 make it difficult for the p-type well 24 to exhibit the p-type characteristics. The present example can at least achieve the goal of reducing the nitrogen vacancy defects. Therefore, the present example is advantageous in that the p-type well 24 and the $p^+$-type well 26 more easily exhibit the p-type characteristics.

In addition, the first annealing of the present example can prevent the front surface 14 of the GaN layer 12 from becoming rough by reducing the vacancy defects. Accordingly, the present example can achieve a flatter interface between the channel forming region 25 and the gate insulator film 32 in the MOSFET 100 than when pre-annealing is not performed. As a result, an interface state that is not desirable from the aspect of the operation of the MOSFET 100 can be reduced at the interface between the channel forming region 25 and the gate insulator film 32.

If $N^+$ ions are implanted into a Group-III nitride semiconductor as disclosed in Japanese Patent Application Publication No. 2002-176004, the defects that should be reduced may increase when compared with the case where only Mg is implanted. Therefore, the implantation of the $N^+$ ions is not desirable.

The first temperature ($T_1$) may be 1200° C. or lower. For example, when the temperature is within the range of 1000° C. or higher and 1200° C. or lower, a plurality of single vacancy defects and aggregated compound vacancy defects formed in the GaN layer 12 are more likely to move. Therefore, the upper limit of the annealing temperature of the step of performing the first annealing may fall within the range of 1000° C. or higher and 1200° C. or lower.

Here, the single vacancy defects may mean a single gallium vacancy ($V_{Ga}$) defect or a single nitrogen vacancy ($V_N$) defect. On the other hand, the aggregated defects may mean a compound vacancy defect formed by one or more gallium vacancies ($V_{Ga}$) defects and one or more nitrogen vacancy ($V_N$) defects. The plurality of single nitrogen vacancy ($V_N$) defects or compound vacancy defects move to the front surface 14 of the GaN layer 12. As a result of this, the nitrogen atoms may be accommodated in the nitrogen vacancies ($V_N$).

The first temperature ($T_1$) may be 800° C. or higher. When the temperature is 800° C. or higher, GaN is decomposed so that nitrogen atoms start to be released. As described above, however, the release of the nitrogen atoms can be prevented within the nitrogen atom containing gas atmosphere of the present example. The upper and lower limits of the first temperature ($T_1$) may be 800° C. or higher and 1200° C. or lower, 800° C. or higher and 1100° C. or lower, 800° C. or higher and 1000° C. or lower, 900° C. or higher and 1200° C. or lower, 900° C. or higher and 1100° C. or lower, or 900° C. or higher and 1000° C. or lower.

In the step of performing the first annealing, the duration of the annealing performed on the GaN layer 12 at the first temperature ($T_1$) may be 10 minutes or longer and 2 hours or shorter. In the present example, the GaN layer 12 is annealed for 30 minutes at the first temperature ($T_1$). By performing the annealing for 10 minutes or longer, it can be at least assured that the vacancy defects move to the front surface 14 and react with the nitrogen atoms. In addition, by performing the annealing for 2 hours or shorter, it can be well assured that the vacancy defects move to the front surface 14 and react with the nitrogen atoms and the GaN layer 12 can be prevented from experiencing unnecessary changes. Here, the upper limit of the duration may be 1.5 hours or shorter, 1 hour or shorter, 50 minutes or shorter, or 40 minutes or shorter. In addition, in order to move the vacancy defects to the front surface 14, as the first temperature ($T_1$) rises, the duration of the annealing of the GaN layer 12 may decrease, and as the first temperature ($T_1$) falls, the duration of the annealing of the GaN layer 12 may increase.

Note that the temperature of the GaN layer 12 and the pressure within the treatment chamber during the first annealing may respectively remain at substantially constant values and may vary within the ranges of ±25° C. and ±5 Pa. The temperature of the GaN layer 12 may be raised to the first temperature ($T_1$) before the first annealing starts, and the temperature of the GaN layer 12 may be lowered from the first temperature ($T_1$) to a predetermined temperature after the first annealing ends. After the first annealing ends, the first stack structure 64 may be unloaded out of the thermal treatment apparatus 200 and transported to a deposition chamber for the next step.

Figure 3D:
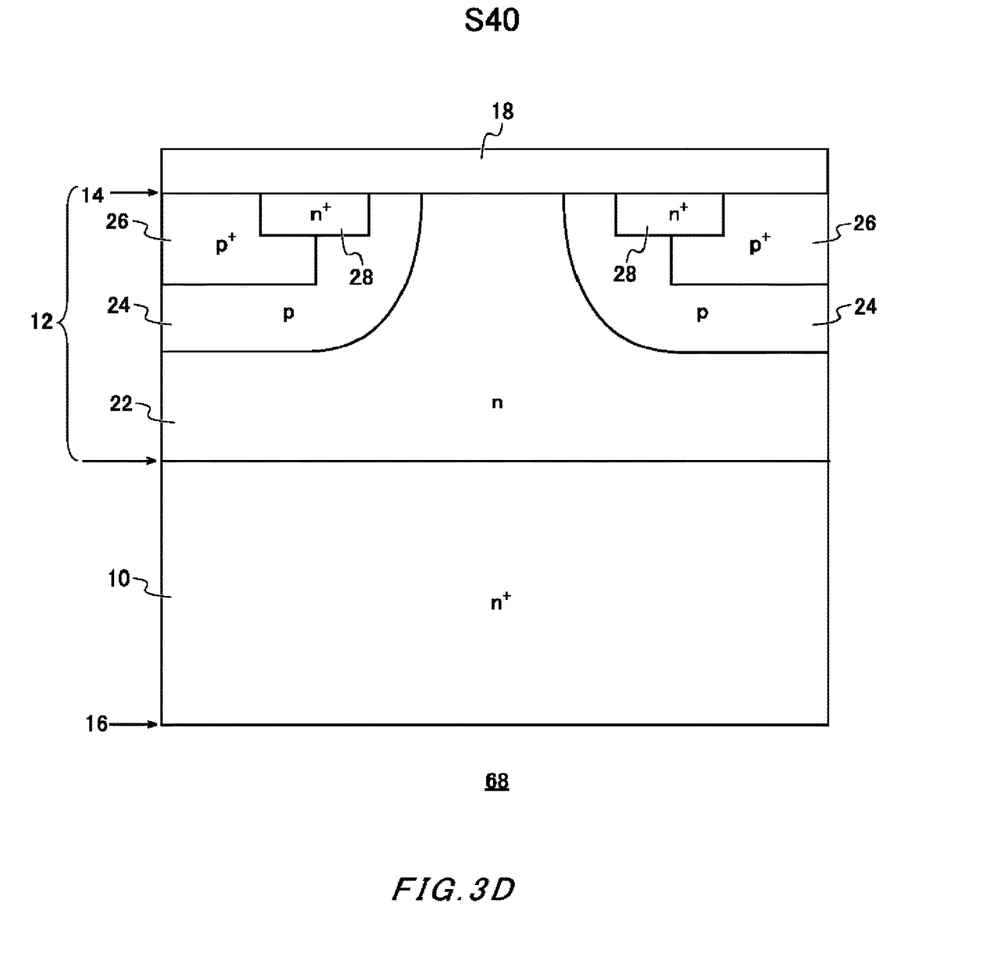
FIG. 3D shows a step S40 of the manufacturing process.

FIG. 3D shows the step S40 of the manufacturing process. In the step S40 of the present example, the protective film 18 is formed on the GaN layer 12 so as to be in direct contact with the GaN layer 12. In this manner, a second stack structure 68 including the GaN substrate 10, the GaN layer 12 and the protective film 18 is formed. The protective film 18 may be capable of reducing the release of the nitrogen atoms from the GaN layer 12 while the second stack structure 68 is annealed at the second temperature ($T_2$), which is higher than the first temperature ($T_1$), in the step S50.

In the present example, it is preferable that the protective film 18 is highly heat-resistant, has good adhesiveness with the GaN layer 12, does not allow the impurities to diffuse into the GaN layer 12 therefrom, and can be selectively removed with respect to the GaN layer 12. When the protective film 18 is highly heat-resistant, the protective film 18 is substantially not decomposed to such a degree that no pits (penetrating openings) are formed in the protective film 18 even if the protective film 18 is subjected to annealing at a temperature of 1100° C. or higher and 1500° C. or lower.

In the present example, the protective film 18 is an AlN film. The AlN film satisfies all of the above-mentioned requirements. Alternatively, the protective film 18 may be a silicon dioxide ($SiO_2$) or silicon nitride (SiN) film. In the case of using the $SiO_2$ or SiN film, however, the likelihood of the diffusion of Si or the n-type impurities into the GaN layer 12 during the annealing cannot be completely eliminated. Therefore, the AlN film is preferable to the $SiO_2$ or SiN film. The protective film 18 may be a layered film in which one or more of a $SiO_2$ film, a SiN film and a GaN film are stacked on an AlN film that is provided on and in direct contact with the GaN layer 12. In this case, the AlN film may also serve as a layer of preventing the n-type impurities from diffusing.

The protective film 18 may be formed by performing sputtering using an AlN target. Note that, in other examples, the protective film 18 may be epitaxially formed using MOCVD, HVPE, MBE, PLD or the like. Alternatively, the protective film 18 may be formed by stacking two or more types of films using different techniques by combining two or more types of techniques selected from sputtering, MOCVD, HVPE, MBE and PLD.

The protective film 18 may have a thickness of 2 nm or more and 1000 nm or less. In the present example, the protective film 18 has a thickness of approximately 200 nm. When the protective film 18 is formed using sputtering, the thickness may be 100 nm or more and 1000 nm or less. When the protective film 18 is formed using MOCVD or HVPE, the thickness may be 2 nm or more and 100 nm or less. When the protective film 18 is formed using MBE or PLD, the thickness may be 10 nm or more and 100 nm or less.

Figure 3E:
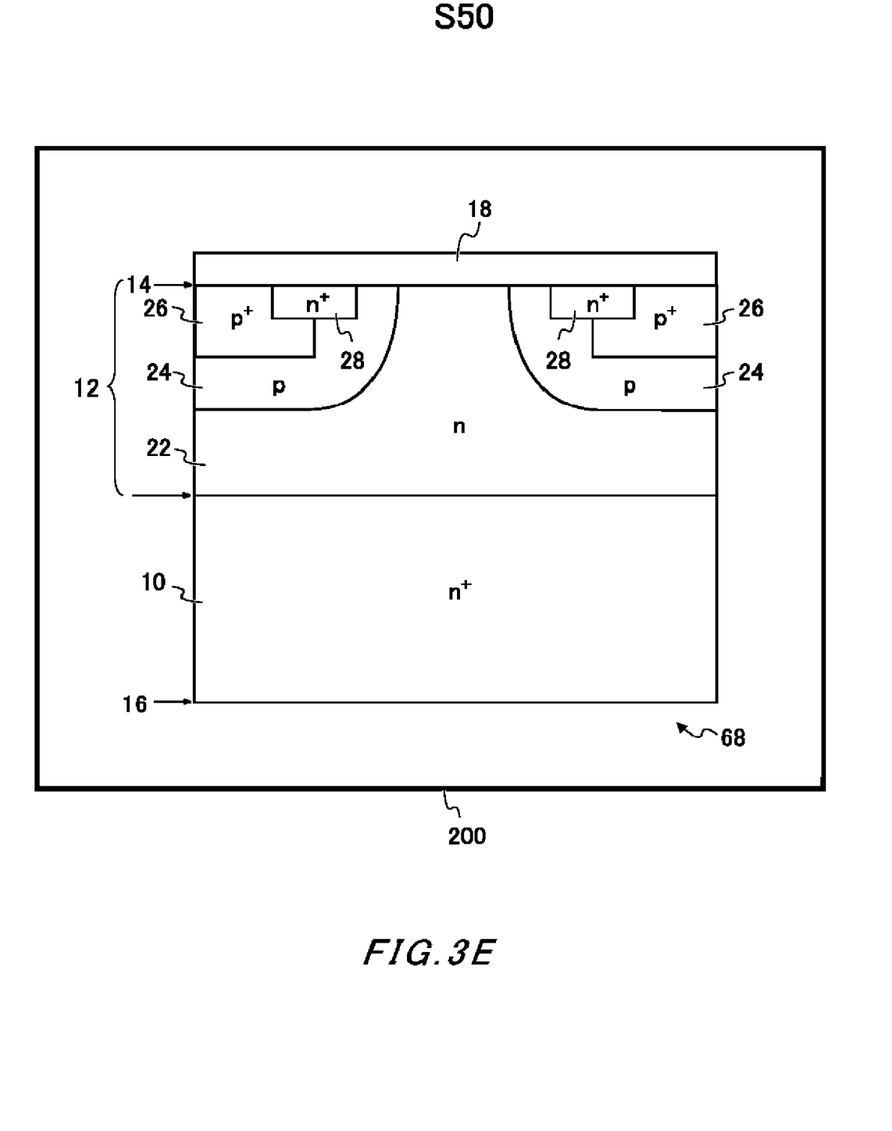
FIG. 3E shows a step S50 of the manufacturing process.

FIG. 3E shows the step S50 of the manufacturing process. In the step S50, the second stack structure 68 is subjected to annealing at the second temperature ($T_2$) using the thermal treatment apparatus 200. The second temperature ($T_2$) during the step of performing the second annealing may be 1100° C. or higher. The second temperature ($T_2$) may be a predetermined temperature within a range of 1300° C. ±200° C. The second temperature ($T_2$) may be 1200° C. or higher and 1500° C. or lower, more preferably 1300° C. or higher and 1500° C. or lower, further more preferably 1400° C. or higher and 1500° C. or lower. The annealing at the second temperature ($T_2$) can repair the crystal defects formed during the ion implantation and sufficiently activate the implanted impurities. Accordingly, the p-type well 24 and the $p^+$-type well 26 can exhibit sufficient p-type characteristics.

In the step of performing the second annealing, the duration of the annealing performed on the GaN layer 12 at the second temperature ($T_2$) may be 1 minute or longer and less than 10 minutes. In the present example, the GaN layer 12 is annealed for 5 minutes at the second temperature ($T_2$). By performing the annealing for 1 minute or longer, it can be at least assured that the crystal defects are repaired and the impurities are activated. In addition, by performing the annealing for less than 10 minutes, it can be well assured that the crystal defects are repaired and the impurities are activated and the GaN layer 12 can be prevented from experiencing unnecessary changes. Note that, in the step S50, the atmosphere within the treatment chamber of the thermal treatment apparatus 200 may be a nitrogen atom containing gas atmosphere with a pressure of 150 MPa or lower. The nitrogen atom containing gas used in the step S50 may contain one or more types of gases selected from nitrogen and ammonia.

As described above, the annealing is performed at the first temperature ($T_1$) without the protective film 18 in the present example. In this way, the vacancy defects in the GaN layer 12 can first escape to the front surface 14 of the GaN layer 12. After this, the protective film 18 is provided and annealing is then performed at the second temperature ($T_2$), which is higher than the first temperature ($T_1$). In this manner, the p-type well 24 and the $p^+$-type well 26 can exhibit sufficient p-type characteristics. Stated differently, the annealing of the GaN layer 12 is conducted in two steps in which the pre-annealing designed to eliminate the vacancy defects is followed by the high-temperature annealing designed to achieve the original purposes. This technical idea provides a completely different annealing procedure than mere combination of annealing performed without the protective film 18 and annealing performed with the protective film 18.

Figure 3F:
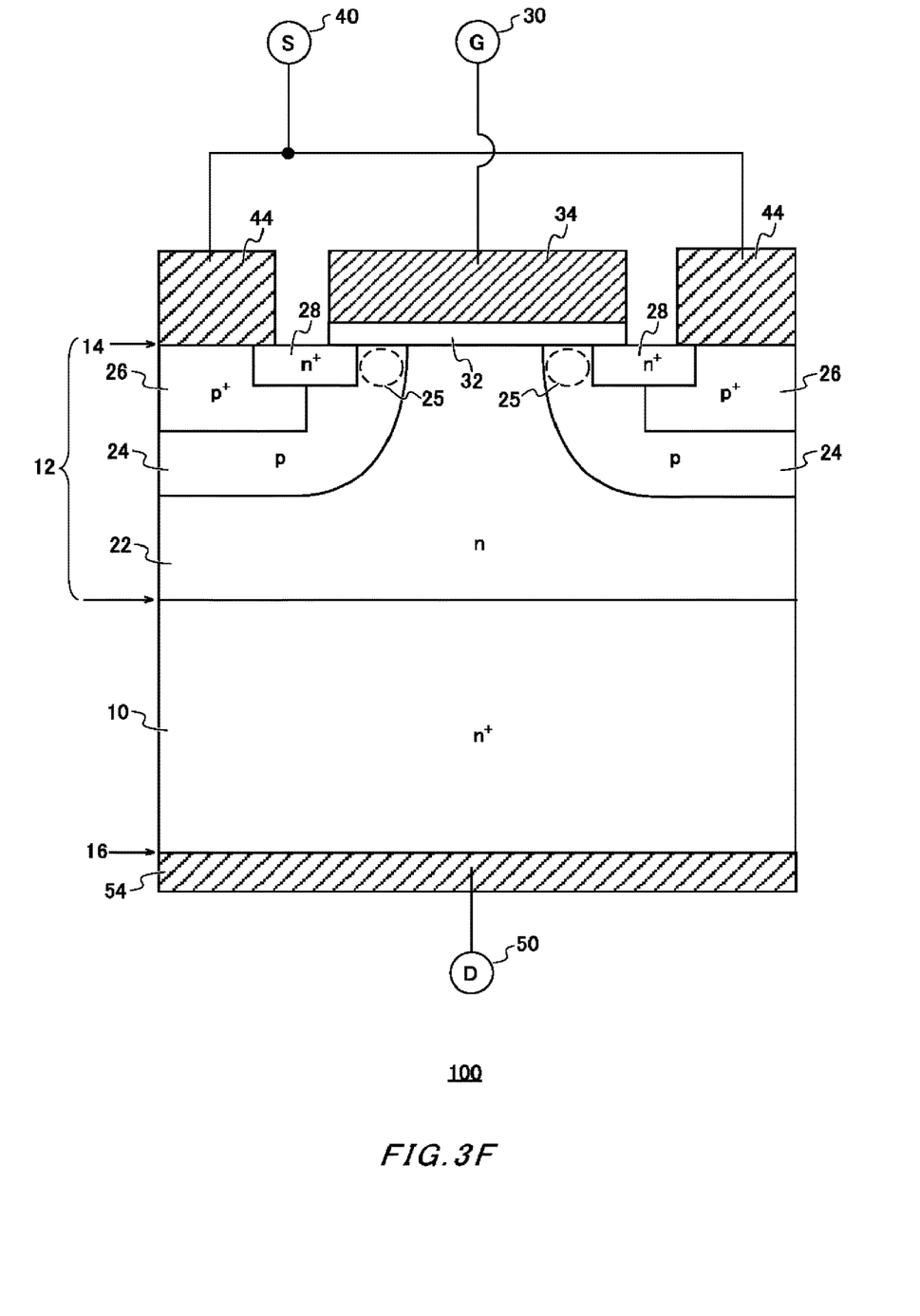
FIG. 3F shows a step S60 of the manufacturing process.

FIG. 3F shows the step S60 of the manufacturing process. In the step S60, known deposition and patterning techniques are employed to form the gate insulator film 32, the gate electrode 34, the source electrode 44 and the drain electrode 54. In the present example, low pressure chemical vapor deposition (LPCVD) is employed to form an $SiO_2$ film, which will serve as the gate insulator film 32. The gate insulator film 32 has a thickness of, for example, 100 nm. Note that the gate insulator film 32 may be, in place of an $SiO_2$ film, a silicon oxynitride (SiON film, an aluminum oxide ($Al_2O_3$) film, a magnesium oxide (MgO) film, a gallium oxide ($GaO_x$) film, a gadolinium oxide ($GdO_x$) film or a layered film including two or more types of these.

Subsequently, polycrystalline silicon is formed using LPCVD to form the gate electrode 34. During or after the deposition of the polycrystalline silicon, the polycrystalline silicon may be doped with one or more types of elements selected from phosphorous (P) and arsenide (As). In this way, the polycrystalline silicon can achieve improved electrical conductivity. Note that the gate electrode 34 may be a metal film made of one of gold (Au), platinum (Pt) and nickel (Ni) or an alloy film formed by these. The gate insulator film 32 and the gate electrode 34 are patterned using photolithography and etching.

Following this, the source electrode 44 is formed. The source electrode 44 may be a stack structure including a titanium (Ti) layer as the lower layer and an Al layer as the upper layer. Note that, in order to lower the contact resistance between the source electrode 44 and the p$^+$-type well 26, the p$^+$-type well 26 may include nickel (Ni), palladium (Pd) or platinum (Pt) at its interface with the source electrode 44. After this, the drain electrode 54 is formed. The drain electrode 54 may be a stack structure including a Ti layer as the upper layer that is in direct contact with the back surface 16 of the GaN substrate 10 and an Al layer as the lower layer.

Subsequently, the gate terminal 30, the source terminal 40 and the drain terminal 50 are respectively connected via interconnections to the gate electrode 34, the source electrode 44 and the drain electrode 54. In this way, the MOSFET 100 is completed.

Figure 4:
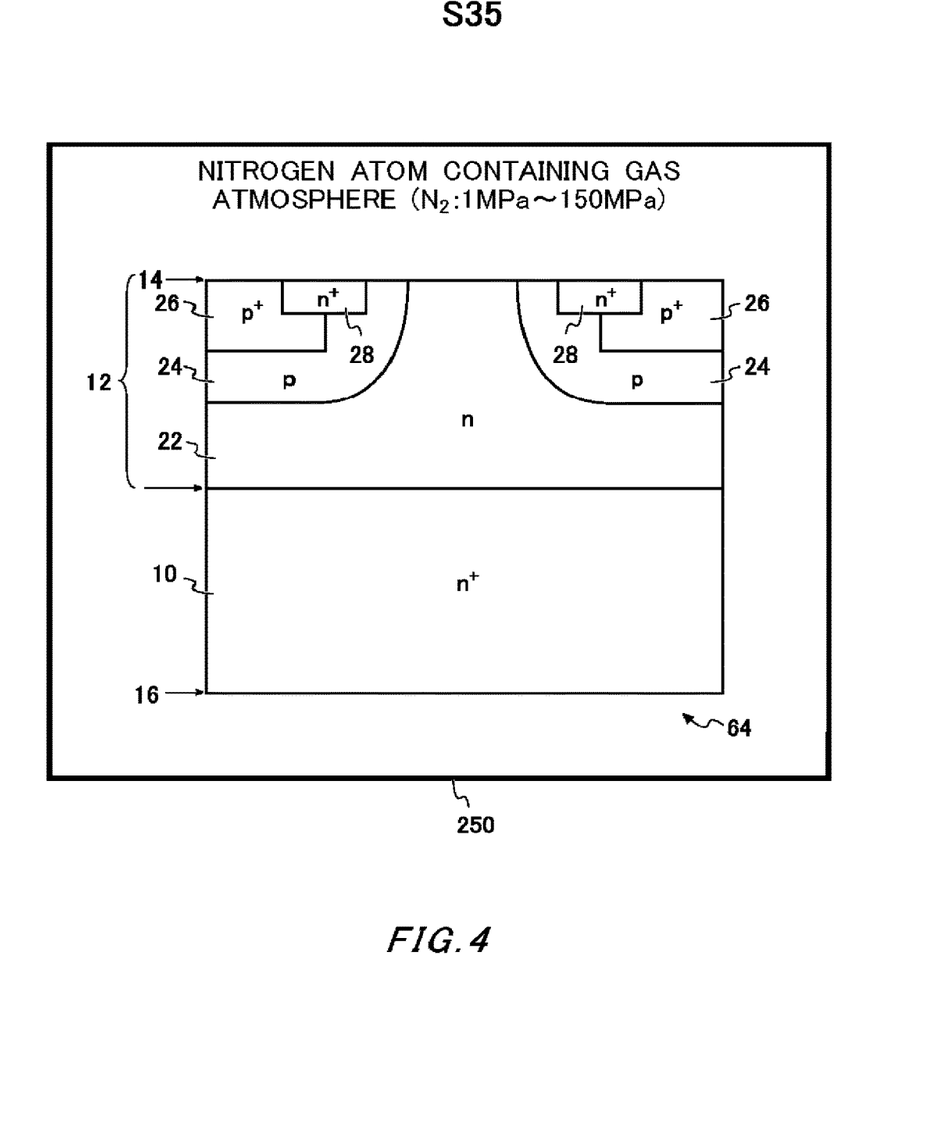
FIG. 4 shows a step S35 of a manufacturing process relating to a second embodiment.

FIG. 4 shows a step S35 of a manufacturing process relating to a second embodiment. In the present example, the step of performing the first annealing (S30) is replaced with a step performing a different first annealing (S35). Except for this, the second embodiment is the same as the first embodiment.

In the step of performing the first annealing (S35) of the present example, the nitrogen atom containing gas contains a nitrogen gas and does not contain an ammonia gas. Note that the nitrogen atom containing gas may contain another inert gas such as argon, in addition to the nitrogen gas. In the present example, the pressure of the nitrogen atom containing gas atmosphere is 1 MPa or higher and 150 MPa or lower. Here, the letter "M" is an SI prefix meaning the sixth power of 10. In the present example, the pressure is set to 150 MPa or lower. Thus, when compared with the case where the pressure is set to the GPa level, the annealing of the GaN layer 12 can be more easily performed using the thermal treatment apparatus 200 having a smaller size.

In the step S35 of the present example, the first stack structure 64 that is made up by the GaN substrate 10 and the GaN layer 12 is positioned within a hot isostatic pressing apparatus 250. Then, the treatment chamber within the hot isostatic pressing apparatus 250 is filled with a nitrogen gas having an initial pressure that is calculated in advance to achieve a desired pressure at a target thermal treatment temperature. Subsequently, the temperature within the hermetically sealed treatment chamber is raised to thermally expand the nitrogen gas. This raises the pressure within the treatment chamber. Within the treatment chamber in which the predetermined temperature and pressure are maintained, the first stack structure 64 is subjected to annealing.

Within the high-pressure nitrogen gas (N$_2$) atmosphere, GaN may be in the state of equilibrium expressed by the chemical reaction formula (1). As the pressure of the nitrogen gas rises, the likelihood of the chemical reaction that achieves the state expressed on the right side of the chemical reaction formula (1) decreases. This prevents the decomposition of GaN(S).

Figure 5:
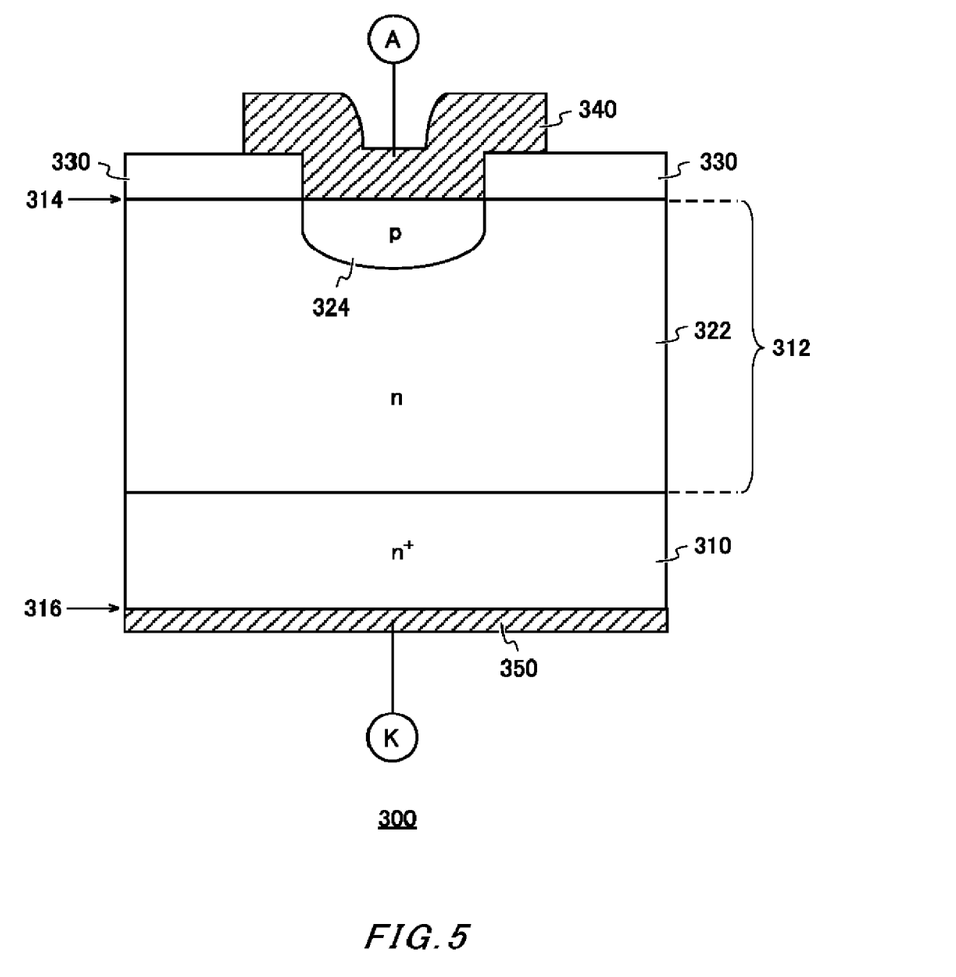
FIG. 5 schematically shows a diode 300 relating to a third embodiment.

FIG. 5 schematically shows a diode 300 relating to a third embodiment. The diode 300, which is shown as an exemplary semiconductor device, includes an n$^+$-type GaN substrate 310, a GaN layer 312, which is shown as an exemplary nitride semiconductor layer, an insulating film 330, an anode electrode 340 and a cathode electrode 350. The insulating film 330 is provided on and in contact with a front surface 314 of the GaN layer 312. In the present example, the insulating film 330 has an opening. The anode electrode 340 is provided on the GaN layer 312 in such a manner that the anode electrode 340 reaches the front surface 314 through the opening. The cathode electrode 350 is in direct contact with a back surface 316 of the GaN substrate 310.

The GaN layer 312 has an n-type region 322 and a p-type well 324. In the present example, the p-type well 324 is exposed at the front surface 314. The anode electrode 340 is electrically connected to the p-type well 324.

The p-type well 324 may be formed by performing the step of implanting the impurities (the step S20) shown in FIG. 3B, the step of performing the first annealing (the step S30 or S35) shown in FIG. 3C, the step of forming the protective film 18 (the step S40) shown in FIG. 3D, and the step of performing the second annealing (the step S50) shown in FIG. 3E. In this manner, the diode 300 may produce the advantageous effects produced by the first and second embodiments.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

DESCRIPTION OF REFERENCE NUMERALS

10 . . . GaN substrate, 12 . . . GaN layer, 14 . . . front surface, 16 . . . back surface, 18 . . . protective film, 22 . . . n-type region, 24 . . . p-type well, 25 . . . channel forming region, 26 . . . p$^+$-type well, 28 . . . n$^+$-type well, 30 . . . gate terminal, 32 . . . gate insulator film, 34 . . . gate electrode, 40 . . . source terminal, 44 . . . source electrode, 50 . . . drain terminal, 54 . . . drain electrode, 64 . . . first stack structure, 68 . . . second stack structure, 100 . . . MOSFET, 200 . . . thermal treatment apparatus, 250 . . . hot isostatic pressing apparatus, 300 . . . diode, 310 . . . GaN substrate, 312 . . . GaN layer, 314 . . . front surface, 316 . . . back surface, 322 . . . n-type region, 324 . . . p-type well, 330 . . . insulating film, 340 . . . anode electrode, 350 . . . cathode electrode

What is claimed is:

1. A manufacturing method of a semiconductor device including a nitride semiconductor layer, the manufacturing method comprising:
   implanting impurities into the nitride semiconductor layer;
   performing a first annealing on the nitride semiconductor layer while an implantation surface on the nitride semiconductor layer remains exposed, the first annealing being at a first temperature within an atmosphere of a nitrogen atom containing gas;
   forming a protective film on the nitride semiconductor layer after the first annealing; and after the protective film is formed, performing a second annealing on the nitride semiconductor layer at a second temperature that is higher than the first temperature.

2. The manufacturing method of a semiconductor device as set forth in claim 1, wherein
the first temperature is a temperature at which thermal decomposition of the nitride semiconductor layer does not proceed within the atmosphere of the nitrogen atom containing gas.

3. The manufacturing method of a semiconductor device as set forth in claim 1, wherein
the nitrogen atom containing gas used for the first annealing contains an ammonia gas.

4. The manufacturing method of a semiconductor device as set forth in claim 3, wherein
the nitrogen atom containing gas used for the first annealing further contains a nitrogen gas.

5. The manufacturing method of a semiconductor device as set forth in claim 1, wherein
the nitrogen atom containing gas used for the first annealing contains a nitrogen gas, and a pressure of the atmosphere of the nitrogen atom containing gas is 1 MPa or higher and 150 MPa or lower.

6. The manufacturing method of a semiconductor device as set forth in claim 1, wherein
the first temperature for the first annealing is 1200° C. or lower.

7. The manufacturing method of a semiconductor device as set forth in claim 1, wherein
the first temperature for the first annealing is 800° C. or higher.

8. The manufacturing method of a semiconductor device as set forth in claim 1, wherein
the second temperature for the second annealing is 1100° C. or higher.

9. The manufacturing method of a semiconductor device as set forth in claim 1, wherein
the nitride semiconductor layer is subjected to the first annealing at the first temperature for a duration of 10 minutes or longer and 2 hours or shorter, and
the nitride semiconductor layer is subjected to the second annealing at the second temperature for a duration of 1 minute or longer and less than 10 minutes.

10. The manufacturing method of a semiconductor device as set forth in claim 1, wherein
the nitride semiconductor layer is made of gallium nitride, and
ion species of the impurities used for the implantation include one or more types from among magnesium, calcium, beryllium and zinc ions.

11. The manufacturing method of a semiconductor device as set forth in claim 1, wherein
the nitrogen atom containing gas contains in partial pressure ratio an ammonia gas of 10% to 20% and a nitrogen gas of 90% to 80%.

* * * * *